(12) United States Patent
Lee et al.

(10) Patent No.: US 12,001,146 B2
(45) Date of Patent: Jun. 4, 2024

(54) OVERLAY MEASURMENT DEVICE

(71) Applicant: AUROS TECHNOLOGY, INC., Hwaseong-si (KR)

(72) Inventors: Sun Hyoung Lee, Pyeongtaek-si (KR); Kil Soo Lee, Hwaseong-si (KR); Seung Soo Lee, Incheon (KR); Gyu Nam Park, Goyang-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 236 days.

(21) Appl. No.: 17/292,994

(22) PCT Filed: Sep. 11, 2019

(86) PCT No.: PCT/KR2019/011802
§ 371 (c)(1),
(2) Date: May 11, 2021

(87) PCT Pub. No.: WO2020/055147
PCT Pub. Date: Mar. 19, 2020

(65) Prior Publication Data
US 2022/0035258 A1 Feb. 3, 2022

(30) Foreign Application Priority Data
Sep. 14, 2018 (KR) ........................ 10-2018-0110421

(51) Int. Cl.
*G02B 27/09* (2006.01)
*G02B 27/10* (2006.01)
*G03F 7/00* (2006.01)

(52) U.S. Cl.
CPC ..... *G03F 7/70633* (2013.01); *G02B 27/0955* (2013.01); *G02B 27/1006* (2013.01); *G03F 7/70641* (2013.01)

(58) Field of Classification Search
CPC ............ G03F 7/70633; G03F 7/70641; G03F 7/0007; G02B 27/0955; G02B 27/1006; G02B 27/1086; G02B 27/1066
See application file for complete search history.

(56) References Cited

U.S. PATENT DOCUMENTS 7,038,739 B2 * 5/2006 Kuan .................. H04N 9/3105
349/8
7,154,928 B2 * 12/2006 Sandstrom .......... G03F 7/70575
372/55

(Continued)

FOREIGN PATENT DOCUMENTS

JP H06-34346 A * 2/1994
JP 2013-187206 A 9/2013

(Continued)

*Primary Examiner* — Mohamed Charioui
*Assistant Examiner* — Lynda Dinh
(74) *Attorney, Agent, or Firm* — NKL Law; Jae Youn Kim

(57) ABSTRACT

An overlay measurement device for measuring an error between a first overlay mark and a second overlay mark respectively formed on different layers formed on a wafer is proposed. The device includes a light source, a first beam splitter configured to split a beam emitted from the light source into two beams, a first color filter configured to adjust a center wavelength and a band width of one of the beams split by the first beam splitter so that the center wavelength and the band width of one of the beams become suitable for acquiring an image of the first overlay mark.

5 Claims, 6 Drawing Sheets

(56) References Cited

U.S. PATENT DOCUMENTS

| | | | | |
|---|---|---|---|---|
| 7,894,062 | B2* | 2/2011 | Choi | G03F 7/70633 |
| | | | | 356/625 |
| 2005/0286598 | A1 | 12/2005 | Sandstrom et al. | |
| 2007/0280557 | A1 | 12/2007 | Choi et al. | |
| 2008/0266561 | A1* | 10/2008 | Kandel | G03F 7/70633 |
| | | | | 356/399 |
| 2011/0222024 | A1* | 9/2011 | Lu | G02B 27/148 |
| | | | | 353/31 |
| 2014/0153246 | A1* | 6/2014 | Huang | G03B 21/2066 |
| | | | | 362/293 |
| 2017/0003650 | A1* | 1/2017 | Moser | G03H 1/0443 |
| 2017/0082932 | A1* | 3/2017 | Fu | G03F 7/70633 |
| 2018/0106731 | A1* | 4/2018 | Rim | G01N 21/956 |

FOREIGN PATENT DOCUMENTS

| | | |
|---|---|---|
| KR | 10-2017-0015453 A | 2/2017 |
| KR | 10-2017-0108015 A | 9/2017 |
| KR | 10-2018-0042649 A | 4/2018 |
| KR | 10-2018-0045026 A | 5/2018 |
| WO | 2018034908 A1 | 2/2018 |

* cited by examiner

OVERLAY MEASURMENT DEVICE

TECHNICAL FIELD

The present invention relates to an overlay measurement device.

BACKGROUND ART

As technology advances, the size of a semiconductor device is reduced, and an increase in the density of integrated circuits is required. In order to meet such a requirement, various conditions must be satisfied. Among these conditions, an overlay tolerance is one of the important indicators.

Semiconductor devices are manufactured through numerous manufacturing processes. In order to form an integrated circuit on a wafer, it is necessary to go through a number of manufacturing processes so that desired circuit structures and elements are sequentially formed at specific locations. The manufacturing processes allow the sequential creation of patterned layers on the wafer. Electrically activated patterns are created in the integrated circuit through these repeated lamination processes. At this time, if the respective structures are not aligned within a tolerance range permitted in the manufacturing processes, interference may occur between the electrically activated patterns, and this phenomenon may cause problems in the performance and reliability of the manufactured circuit. An overlay measurement tool is used to measure and verify alignment errors between these layers.

Typical overlay measurement methods measure and verify whether the alignment between two layers falls within a tolerance. One of the overlay measurement methods is a method in which an overlay is measured by forming structures called overlay marks at specific positions on a substrate and imaging the structures with an optical image acquisition device. The structures for measurement are designed to make it possible to measure an overlay in at least one of the X and Y directions for each layer. The respective structures are designed as symmetrical structures. The center value between the structures arranged in a symmetrical direction is calculated and used as a representative value of the corresponding layer, and an overlay error is derived by calculating the relative difference between the representative values of the respective layers.

In the case of measuring the overlay of two layers, as shown in FIGS. 1 and 2, a box-shaped major scale 1 and a box-shaped minor scale 2 smaller than the box-shaped major scale 1 are formed on two consecutive layers, respectively. Then, as shown in FIGS. 3 and 4, a waveform representing the position-dependent change in the intensity of the signal obtained by using the major scale 1 as a focal plane is obtained to obtain the center value C1 of the major scale 1. A waveform representing the position-dependent change in the intensity of the signal obtained by using the minor scale 2 as a focal plane is obtained to obtain the center value C2 of the minor scale 2. Thus, the overlay error between the two layers is measured.

However, this method has a problem in that the waveforms or images of the major scale 1 and the minor scale 2 are obtained through the use of the same beam without taking into account the fact that the major scale 1 and the minor scale 2 are formed of different materials in different layers and the major scale 1 is covered by the layer on which the minor scale 2 is formed. In addition, there is a problem in that this method fails to consider the fact that the magnifications of the obtained waveforms or images are different because the heights of the major scale 1 and the minor scale 2 are different due to the height difference between the layer on which the major scale 1 is formed and the layer on which the minor scale 2 is formed.

In recent years, due to the development of semiconductor process technology, there is a need to accurately and rapidly measure an overlay error between layers having a large height difference and different optical properties. Thus, there is a growing demand for solving these problems.

SUMMARY

In view of the aforementioned problems, it is an object of the present invention to provide a novel overlay measurement device capable of accurately and rapidly measuring an overlay error between layers having a large height difference and different optical properties.

In order to achieve the above object, the present invention provides an overlay measurement device for measuring an error between a first overlay mark and a second overlay mark respectively formed on different layers formed on a wafer, including: a light source; a first beam splitter configured to split a beam emitted from the light source into two beams; a first color filter configured to adjust a center wavelength and a band width of one of the beams split by the first beam splitter so that the center wavelength and the band width of one of the beams become suitable for acquiring an image of the first overlay mark; a second color filter configured to adjust a center wavelength and a band width of the other of the beams split by the first beam splitter so that the center wavelength and the band width of the other of the beams become suitable for acquiring an image of the second overlay mark; a beam combiner configured to combine the beams passed through the first color filter and the second color filter; an objective lens configured to condense the beam combined by the beam combiner at a measurement position on the wafer and collect the beam reflected from the measurement position; a second beam splitter configured to split the beam collected by the objective lens into two beams; a first detector configured to acquire an image of the first overlay mark by detecting one of the beams split by the second beam splitter; and a second detector configured to acquire an image of the second overlay mark by detecting the other of the beams split by the second beam splitter.

The device may further include: a focus actuator configured to adjust a distance between the second beam splitter and the second detector.

The device may further include: a zoom lens installed between the second beam splitter and the focus actuator and configured to match magnifications of the image of the second overlay mark and the image of the first overlay mark by using a position change value for the second detector actuated by the focus actuator.

The device may further include: a third beam splitter configured to split the beam passed through the beam combiner into two beams; and a beam detector configured to analyze an optical property of one of the beams split by the third beam splitter, wherein the other of the beams split by the third beam splitter is directed toward the objective lens.

In the device, the first beam splitter and the second beam splitter may be configured to split an incident beam into a reflected beam and a transmitted beam.

In the device, the second beam splitter may include a tube beam splitter and a dichroic filter, and may be configured to split an incident beam into a beam suitable for acquiring the image of the first overlay mark and a beam suitable for acquiring the image of the second overlay mark.

According to the present invention, it is possible to provide an overlay measurement device capable of accurately and rapidly measuring an overlay error between layers having a large height difference and different optical properties.

DETAILED DESCRIPTION

Figure 1:
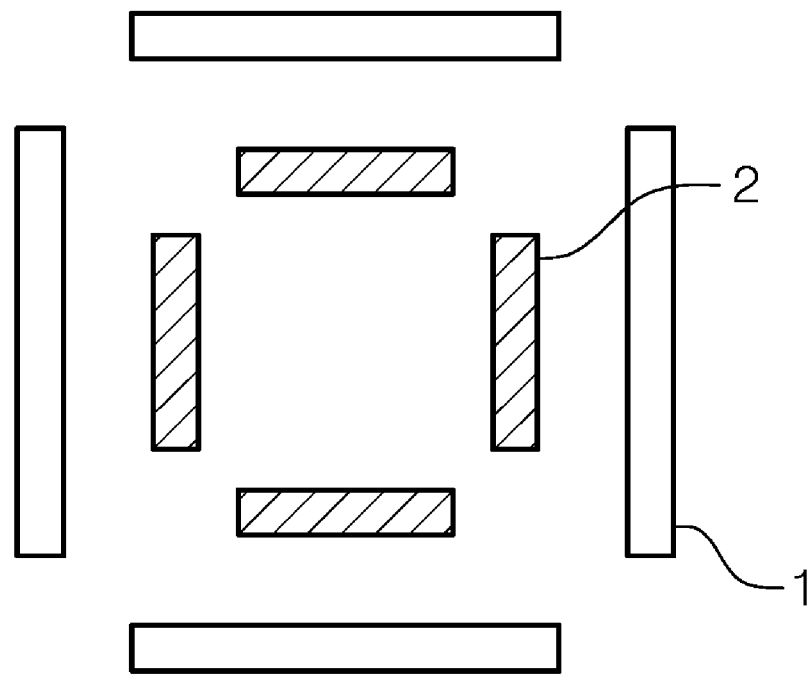
FIG. 1 is a plan view of an overlay mark.
Figure 2:
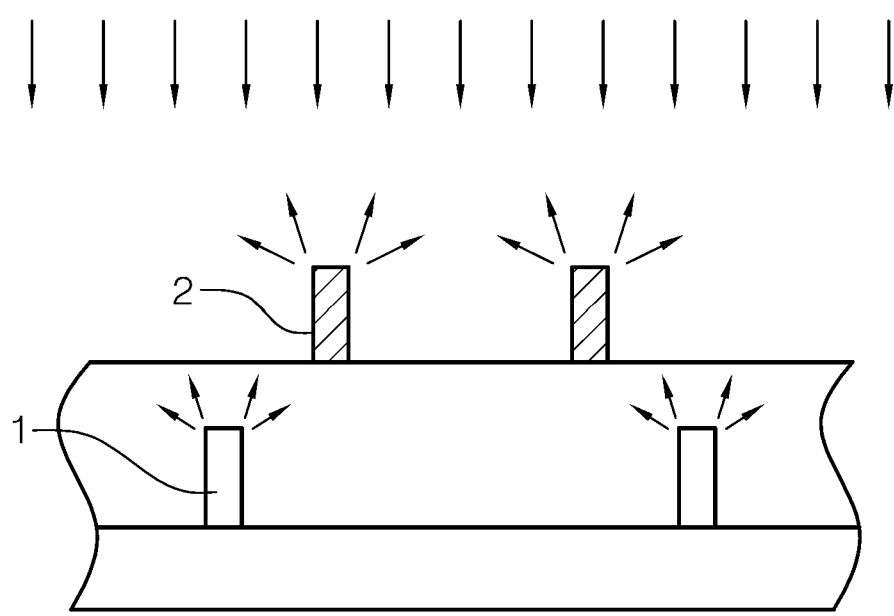
FIG. 2 is a side view of the overlay mark shown in FIG. 1.
Figure 3:
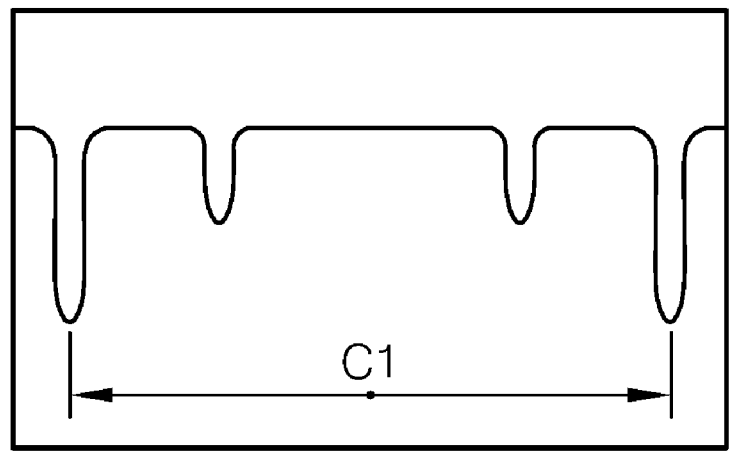
FIG. 3 shows a position-dependent waveform change in the intensity of a signal obtained by using a major scale of the overlay mark shown in FIG. 1 as a focal plane.
Figure 4:
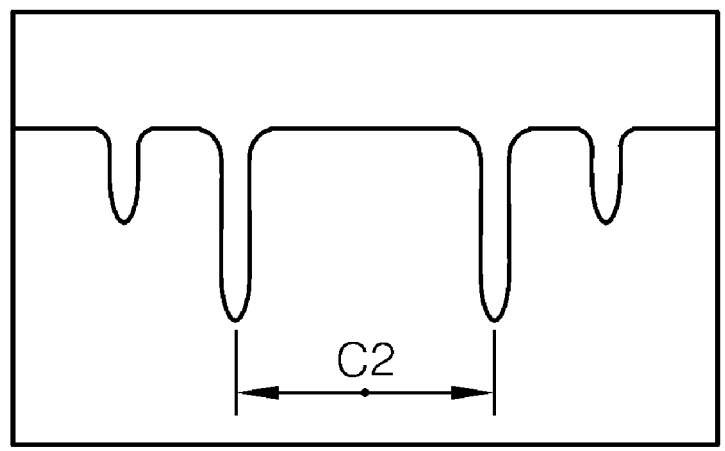
FIG. 4 shows a position-dependent waveform change in the intensity of a signal obtained by using a minor scale of the overlay mark shown in FIG. 1 as a focal plane.

Hereinafter, exemplary embodiments of the present invention will be described in detail with reference to the accompanying drawings. However, the embodiments of the present invention may be modified into various other forms, and the scope of the present invention should not be construed as being limited to the embodiments described below. Embodiments of the present invention are provided to more completely describe the present invention to those of ordinary skill in the art. Accordingly, the shapes of elements in the drawings are exaggerated in order to emphasize a more clear description. The elements indicated by the same reference numerals in the drawings mean the same elements.

Figure 5:
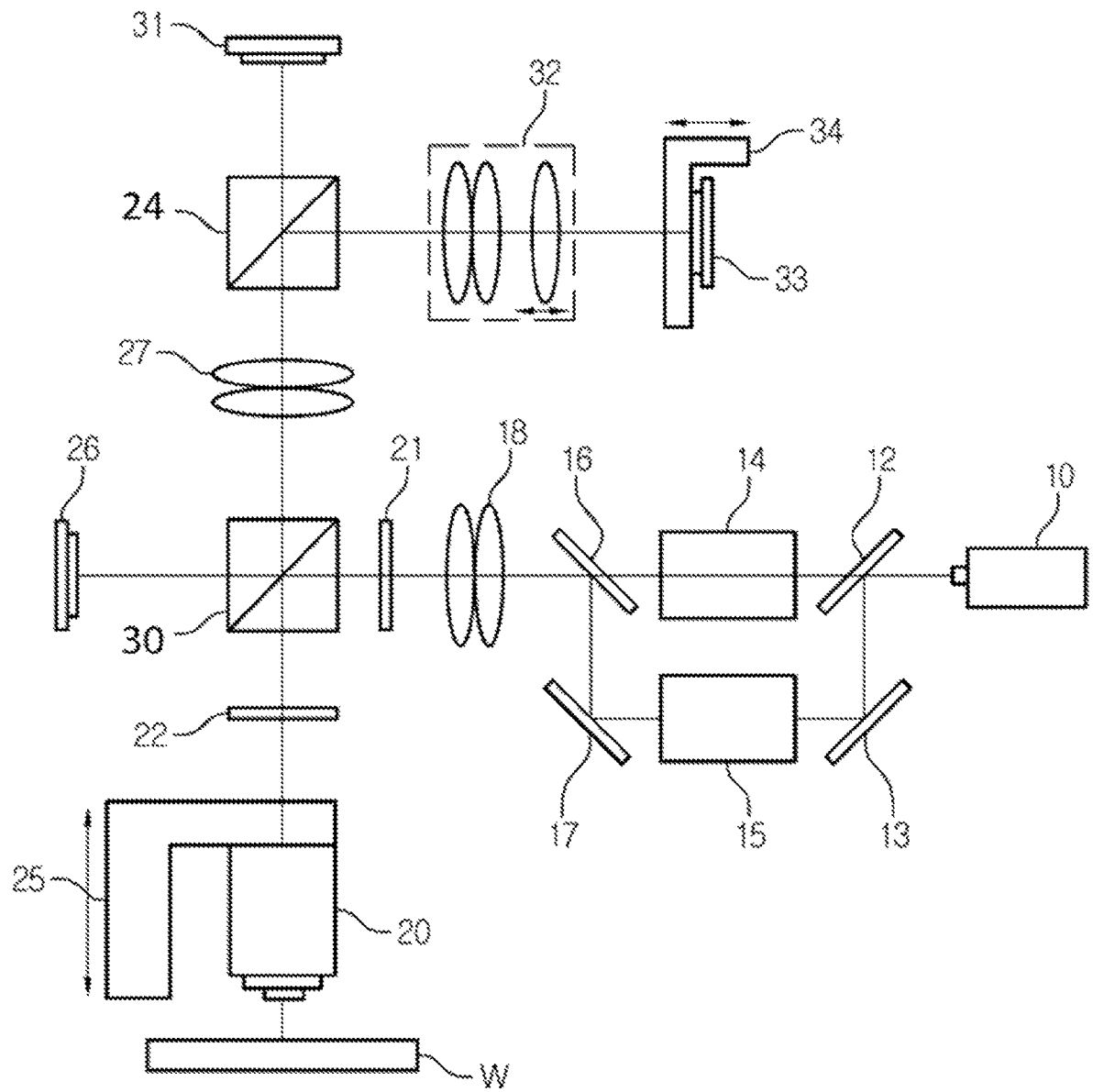
FIG. 5 is a conceptual diagram of an overlay measurement device according to an embodiment of the present invention.

FIG. 5 is a conceptual diagram of an overlay measurement device according to an embodiment of the present invention. The overlay measurement device is a device that measures an error between a first overlay mark OM1 and a second overlay mark OM2 respectively formed on different layers formed on a wafer w.

Figure 8:
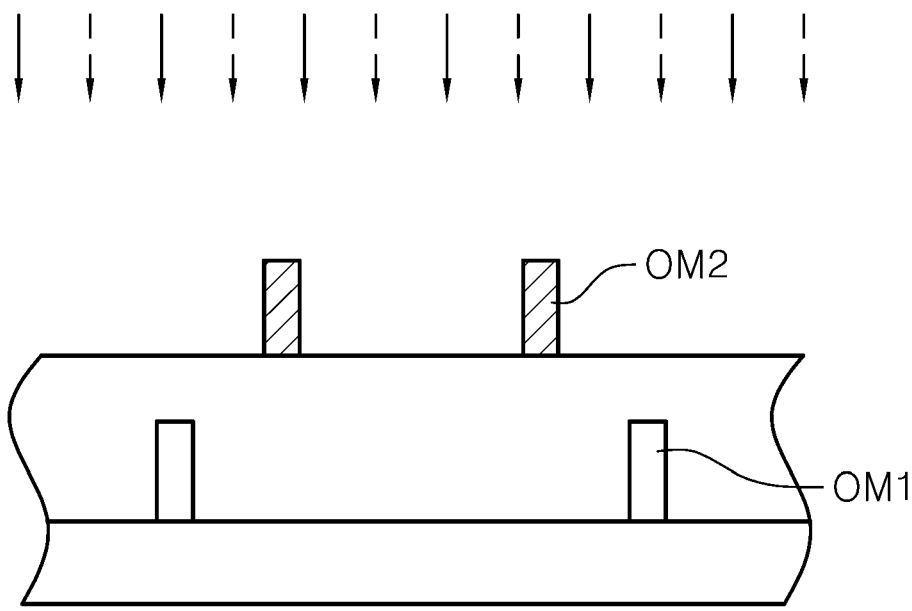
FIG. 8 is a diagram for explaining a method of irradiating a beam onto a first overlay mark and a second overlay mark formed on a wafer.

For example, as illustrated in FIG. 8, the first overlay mark OM1 may be an overlay mark formed on a previous layer, and the second overlay mark OM2 may be an overlay mark formed on a current layer. The overlay marks are formed on a scribe line while constituting layers for forming a semiconductor device in a die region. For example, the first overlay mark OM1 may be formed together with an insulating layer pattern, and the second overlay mark OM2 may be formed together with a photoresist pattern formed on the insulating layer pattern.

In this case, the second overlay mark OM2 is exposed to the outside, but the first overlay mark OM1 is covered by a photoresist layer. The first overlay mark OM1 is made of an oxide having an optical property different from that of the second overlay mark OM2 made of a photoresist material. Furthermore, the heights of the first overlay mark OM1 and the second overlay mark OM2 are different from each other.

According to the present invention, an overlay error can be accurately and rapidly measured by irradiating a beam suitable for the optical property of the material forming each of the first overlay mark OM1 and the second overlay mark OM2 onto each of the overlay marks, and adjusting the magnification in consideration of the height difference between the overlay marks.

As the overlay marks, it may be possible to various types of overlay marks currently used, such as a box-in-box (BIB) overlay mark (see FIG. 1), an advanced imaging metrology (AIM) overlay mark, and the like. Hereinafter, a description will be mainly made based on the box-in-box overlay mark having a simple structure.

As shown in FIG. 5, the overlay measurement device according to an embodiment of the present invention includes a light source 10, a first beam splitter 12, a first color filter 14, a second color filter 15, a beam combiner 16, a second beam splitter 24, an objective lens 20, a third beam splitter 30, a first detector 31, a second detector 33 and a beam detector 26.

As the light source 10, it may be possible to use a halogen lamp, a xenon lamp, a super continuum laser, a light emitting diode, a laser induced lamp, or the like.

The first beam splitter 12 serves to split the beam emitted from the light source 10 into two beams. That is, the first beam splitter 12 transmits a part of the beam emitted from the light source 10 and reflects a part of the beam to split the beam emitted from the light source 10 into two beams.

The first color filter 14 serves to adjust the center wavelength and band width of the beam split by the first beam splitter 12 and passed through the first beam splitter 12, so that the center wavelength and band width of the beam become suitable for the acquisition of an image of the second overlay mark OM2 formed on the current layer.

Figure 6:
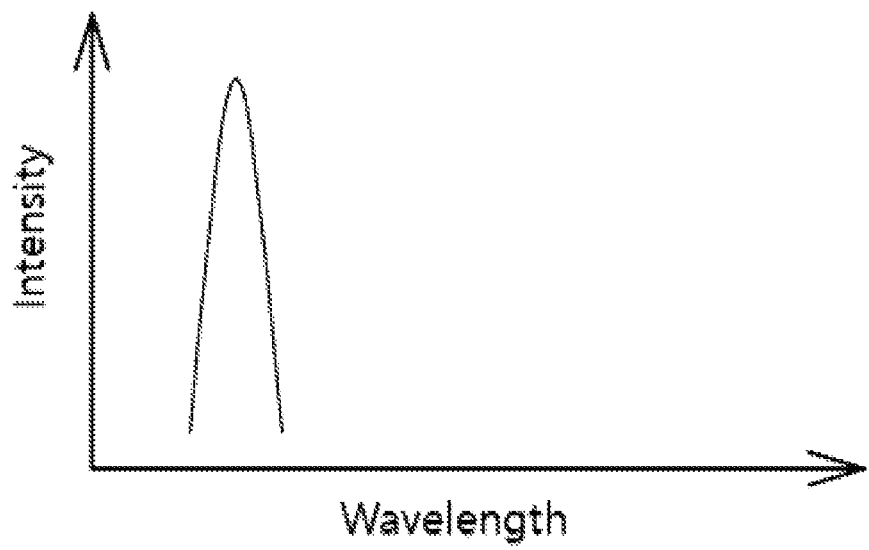
FIG. 6 is a diagram showing the wavelength-dependent intensity of a beam passing through a first color filter shown in FIG. 5.

FIG. 6 is a diagram showing the wavelength-dependent intensity of the beam passed through the first color filter shown in FIG. 5. As shown in FIG. 6, the center wavelength of the beam passed through the first color filter 14 is shortened, and the band width thereof is decreased.

The second color filter 15 serves to adjust the center wavelength and band width of the beam split by the first beam splitter 12 and reflected by the first beam splitter 12, so that the center wavelength and band width of the beam become suitable for the acquisition of an image of the first overlay mark OM2 formed on the previous layer. The path of the beam reflected by the first beam splitter 12 is changed by a first mirror 13 installed between the first beam splitter 12 and the second color filter 15, so that the beam is directed toward the second color filter 15.

Figure 7:
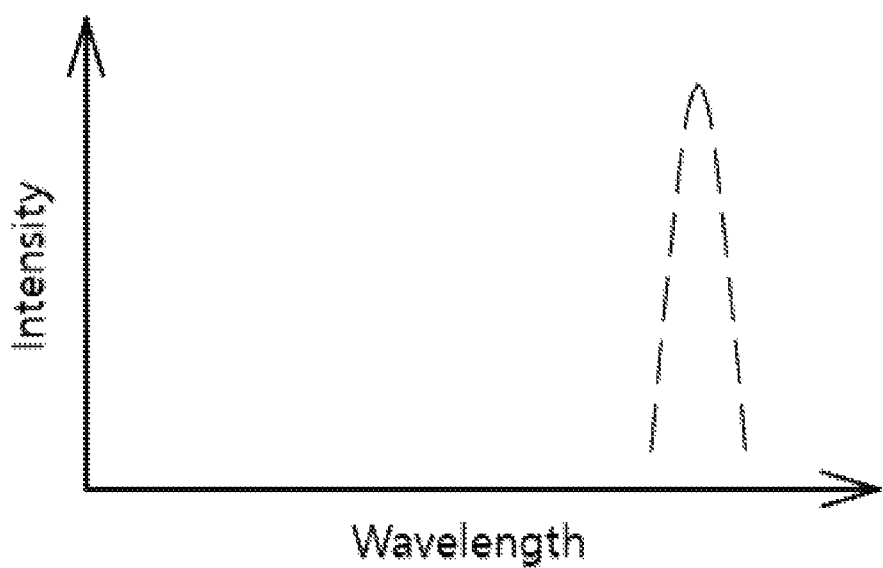
FIG. 7 is a diagram showing the wavelength-dependent intensity of a beam passing through a second color filter shown in FIG. 5.

FIG. 7 is a diagram showing the wavelength-dependent intensity of the beam passed through the second color filter shown in FIG. 5. As shown in FIG. 7, the center wavelength of the beam passed through the second color filter 15 is shortened, and the band width thereof is decreased.

The beam combiner 16 serves to combine the beams passed through the first color filter 14 and the second color filter 15. The beam passed through the first color filter 14 passes through the beam combiner 16. The path of the beam passed through the second color filter 15 is changed by a second mirror 17, so that the beam is directed toward the beam combiner 16. Thereafter, the beam is reflected by the beam combiner 16 and combined with the beam passed through the beam combiner 16.

The third beam splitter 30 serves to split the beam combined by the beam combiner 16 into two beams again. The beam combined by the beam combiner 16 is polarized through a relay lens 18 and a polarization filter 21, and is split into two beams in the third beam splitter 30.

The objective lens 20 serves to condense the beam, which is circularly polarized through a lambda wave plate 22 after being combined by the beam combiner 16 and reflected by the third beam splitter 30, at a measurement position on the wafer w, and collect the beam reflected at the measurement position. The objective lens 20 is installed on a lens focus actuator 25.

FIG. 8 is a diagram for explaining a method of irradiating a beam onto the first overlay mark and the second overlay mark formed on the wafer. The solid line represents a beam suitable for measurement of the second overlay mark OM2, and the dotted line represents a beam suitable for measurement of the first overlay mark OM1. As shown in FIG. 8, the beam is condensed at the measurement position where the first overlay mark OM1 and the second overlay mark OM2 are formed on the wafer w, and the reflected beam is collected. The lens focus actuator 25 may adjust the distance between the objective lens 20 and the wafer w so that the focal plane is positioned on the first overlay mark OM1 or the second overlay mark OM2. In the present embodiment, a description will be made under the assumption that the focal plane is positioned on the second overlay mark OM2 formed on the current layer.

The second beam splitter 24 serves to split the beam collected by the objective lens 20 into two beams. The second beam splitter 24 may include a tube beam splitter and a dichroic filter. The dichroic filter is a filter that transmits a beam having a specific wavelength. The beam collected by the objective lens 20 is split into two beams by the second beam splitter 24 after passing through the lambda wave plate 22, the third beam splitter 30 and the tube lens 27. That is, the beam collected by the objective lens 20 is split into a beam suitable for detection of the first overlay mark OM1 and a beam suitable for detection of the second overlay mark OM2. As shown in FIGS. 6 and 7, the beam suitable for detection of the first overlay mark OM1 and the beam suitable for detection of the second overlay mark OM2 have a difference in the center wavelength and a narrow band width. Therefore, they can be easily split using the dichroic filter.

The first detector 31 detects the beam passed through the second beam splitter 24. The first detector 31 may acquire an image of the second overlay mark OM2.

Figure 9:
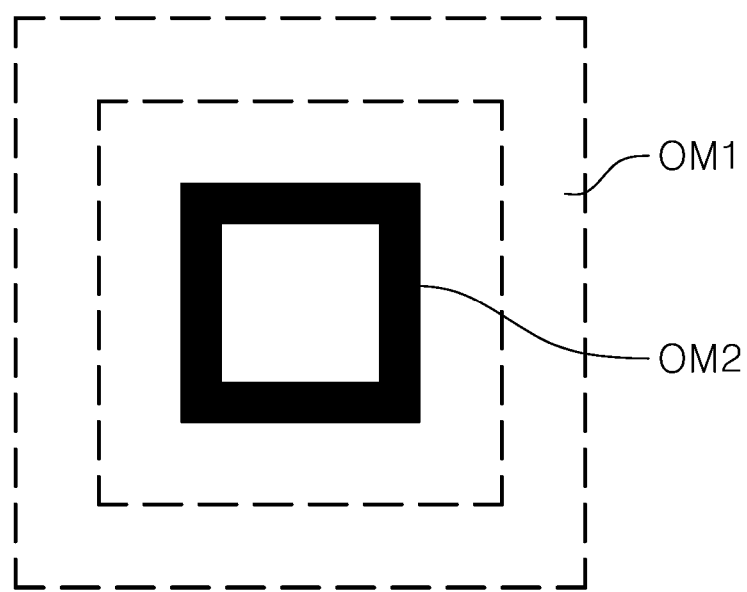
FIG. 9 is a diagram illustrating an image acquired by a first detector shown in FIG. 5.

FIG. 9 is a diagram illustrating an image acquired by the first detector shown in FIG. 5. As shown in FIG. 9, in the image acquired by the first detector 31, the second overlay mark OM2 is clearly indicated, and the first overlay mark OM1 is blurred. This is because the focal plane is positioned on the second overlay mark OM2.

The second detector 33 detects the beam reflected from the second beam splitter 24. The second detector 33 is installed on the focus actuator 34 so that the distance between the second beam splitter 24 and the second detector 33 can be adjusted. The second detector 33 acquires an image of the first overlay mark OM1.

As described above, the distance between the objective lens 20 and the wafer w is adjusted so that the focal plane is positioned on the second overlay mark OM2. Therefore, in order to acquire a clear image of the first overlay mark OM1, the distance between the second detector 33 and the second beam splitter 24 should be adjusted through the use of the focus actuator 34 according to the height difference between the first overlay mark OM1 and the second overlay mark OM2.

A zoom lens 32 is installed between the second beam splitter 24 and the focus actuator 34. The zoom lens 32 serves to receive a position change value for the second detector 33 from the focus actuator 34 and matches the magnifications of the image of the second overlay mark OM2 and the image of the first overlay mark OM1 based on the position change value. Due to the height difference between the first overlay mark OM1 and the second overlay mark OM2, the optical path distance between the second detector 33 and the second beam splitter 24 is different from the optical path distance between the first detector 31 and the second beam splitter 24. Therefore, the magnification of the image acquired by the first detector 31 and the magnification of the image acquired by the second detector 33 may be different from each other. In order to accurately measure the overlay error, the magnifications have to be matched.

Figure 10:
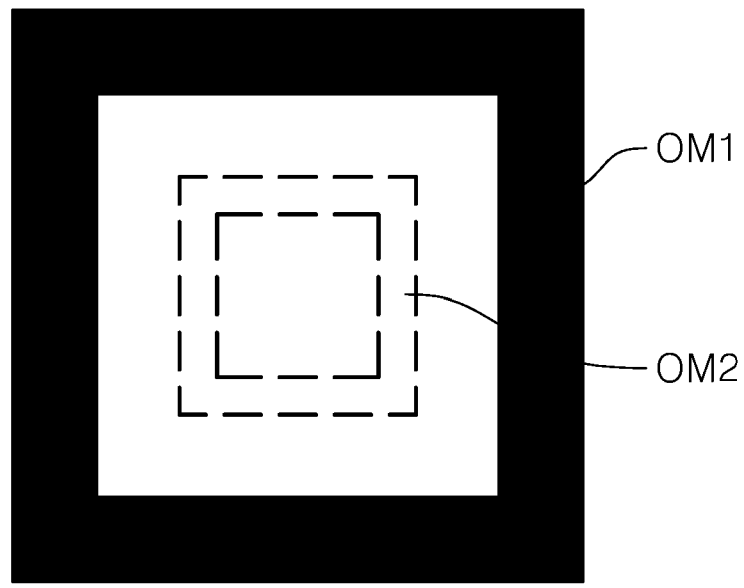
FIG. 10 is a diagram illustrating an image acquired by a second detector shown in FIG. 5.

FIG. 10 is a diagram illustrating an image acquired by the second detector shown in FIG. 5. As shown in FIG. 10, in the image acquired by the second detector 33, the first overlay mark OM1 is clearly displayed, and the second overlay mark OM2 is blurred. This is because the position of the second detector 33 is adjusted by the focus actuator 34 so that the first overlay mark OM1 is clearly displayed. In addition, since the magnification is adjusted by the zoom lens 32, the magnification is the same as that of the image shown in FIG. 9.

The beam detector 26 serves to analyze whether the beam passed through the third beam splitter 30 is in an optimized state.

Figure 11:
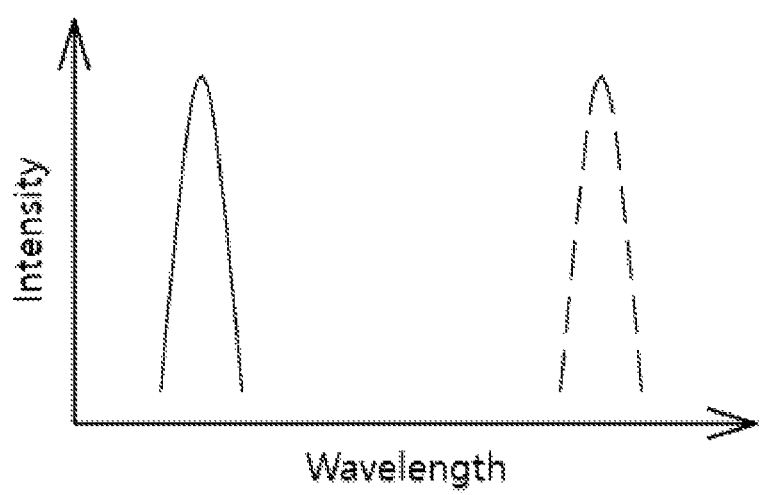
FIG. 11 is a diagram showing the wavelength-dependent intensity of a beam obtained by a beam detector shown in FIG. 5.

FIG. 11 is a diagram showing the wavelength-dependent intensity of the beam obtained by the beam detector shown in FIG. 5. The beam analyzed by the beam detector 26 is a combination of the beams passed through the first color filter 14 and the second color filter 15. Therefore, as shown in FIG. 11, the graph showing the wavelength-dependent intensity of the beam detected by the beam detector 26 is a combination of the graphs shown in FIGS. 6 and 7.

The embodiments described above merely describe preferred embodiments of the present invention, and the scope of the present invention is not limited to the described embodiments. Various changes, modifications or substitutions may be made by those skilled in the art within the technical spirit and the claims of the present invention. Such embodiments are to be understood as falling within the scope of the present invention.

DESCRIPTION OF REFERENCE NUMERALS w: wafer, OM1: first overlay mark, OM2: second overlay mark, 10: light source, 12: first beam splitter, 14: first color filter, 15: second color filter, 16: beam combiner, 20: objective lens, 30: second beam splitter, 25: lens focus actuator, 26: beam detector, 24: third beam splitter, 31: first detector, 32: zoom lens, 33: second detector, 34: focus actuator

What is claimed is:

1. An overlay measurement device for measuring an error between a first overlay mark and a second overlay mark respectively formed on different layers formed on a wafer, comprising:
   a light source;
   a first beam splitter configured to split a beam emitted from the light source into a first beam and a second beam;
   a first color filter configured to adjust a first center wavelength and a first band width of the first beam so that the first center wavelength and the first band width of the first beam become suitable for acquiring an image of the first overlay mark;
   a second color filter configured to adjust a second center wavelength and a second band width of the second beam of the two beams split by the first beam splitter so that the second center wavelength and the second band width of the second beam become suitable for acquiring an image of the second overlay mark;
   a beam combiner configured to combine the first beam and the second beam;
   an objective lens configured to condense a beam combined by the beam combiner at a measurement position on the wafer and collect a beam reflected from the measurement position, wherein the first center wavelength and the first band width of the first beam are suitable for acquiring the image of the first overlay mark in the beam combined by the beam combiner and in the beam reflected from the measurement position and collected by the objective lens, and the second center wavelength and the second band width of the second beam are suitable for acquiring the image of the second overlay mark in the beam combined by the beam combiner and in the beam reflected from the measurement position and collected by the objective lens;
   a second beam splitter configured to split the beam reflected from the measurement position and collected by the objective lens into a third beam having the first center wavelength and the first band width and a fourth beam having the second center wavelength and the second band width;
   a first detector configured to acquire the image of the second overlay mark by detecting the third beam having the first center wavelength and the first band width;
   a second detector configured to acquire the image of the first overlay mark by detecting the fourth beam having the second center wavelength and the second band width;
   a third beam splitter configured to split the beam passed through the beam combiner into two beams; and
   a beam detector configured to analyze an optical property of one of the beams split by the third beam splitter,
   wherein the other of the beams split by the third beam splitter is directed toward the objective lens, and the other of the beams is condensed at a measurement position on the wafer by the objective lens.

2. The device according to claim 1, further comprising:
   a focus actuator configured to adjust a distance between the second beam splitter and the second detector.

3. The device according to claim 2, further comprising:
   a zoom lens installed between the second beam splitter and the focus actuator and configured to match magnifications of the image of the second overlay mark and the image of the first overlay mark by using a position change value for the second detector actuated by the focus actuator.

4. The device according to claim 1, wherein the first beam splitter and the second beam splitter are configured to split an incident beam into a reflected beam and a transmitted beam.

5. The device according to claim 1, wherein the second beam splitter includes a tube beam splitter and a dichroic filter.

* * * * *